(12) United States Patent
Liang

(10) Patent No.: US 9,677,783 B2
(45) Date of Patent: Jun. 13, 2017

(54) DEVICE FOR CONTROLLING AIRFLOW FIELD AND METHOD THEREOF

(71) Applicant: Delta Electronics, Inc., Taoyuan County (TW)

(72) Inventor: Jen-Te Liang, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 592 days.

(21) Appl. No.: 14/228,352

(22) Filed: Mar. 28, 2014

(65) Prior Publication Data

US 2015/0044962 A1 Feb. 12, 2015

(30) Foreign Application Priority Data

Aug. 9, 2013 (TW) .............................. 102128597 A

(51) Int. Cl.
| | |
|---|---|
| *F24F 7/00* | (2006.01) |
| *F24F 11/00* | (2006.01) |
| *F24F 11/053* | (2006.01) |
| *H05K 7/20* | (2006.01) |

(52) U.S. Cl.
CPC ........ *F24F 11/053* (2013.01); *H05K 7/20745* (2013.01); *H05K 7/20836* (2013.01)

(58) Field of Classification Search
CPC F24F 11/053; F24F 2221/40; H05K 7/20745; H05K 7/20836
See application file for complete search history.

(56) References Cited

U.S. PATENT DOCUMENTS

| | | | | |
|---|---|---|---|---|
| 5,671,805 A | * | 9/1997 | Ståhl ................... | H05K 7/2059 165/104.33 |
| 6,374,627 B1 | * | 4/2002 | Schumacher ........ | B60H 1/3232 62/239 |
| 6,574,104 B2 | * | 6/2003 | Patel .................. | H05K 7/20745 165/104.33 |

(Continued)

FOREIGN PATENT DOCUMENTS

| | | |
|---|---|---|
| TW | M397498 | 2/2011 |
| TW | 201332426 | 8/2013 |

OTHER PUBLICATIONS

Office Action dated Jan. 13, 2015 from corresponding application No. TW 102128597.

*Primary Examiner* — Steven B McAllister
*Assistant Examiner* — Jonathan Cotov
(74) *Attorney, Agent, or Firm* — Hauptman Ham, LLP

(57) ABSTRACT

The present invention is related to a device for controlling an airflow field and a method thereof. The method is included of: supplying a cooling airflow into an air conditioning space, smoothly altering flux of the cooling airflow, retrieving a backflow temperature of the cooling airflow, and comparing variation of the backflow temperature with a flux variation of the cooling airflow. Only part of the air conditioning space is covered in the circulation range of the cooling airflow if the backflow temperature is varying in the same tendency as the flux variation. The device is included of an air conditioning cabinet and a chiller. The air conditioning cabinet is included of a coil pipe, a fan corresponding to the coil pipe and a processing module electrically connected to the fan. The chiller is connected to the coil pipe to supply cooling water in to the coil pipe.

14 Claims, 6 Drawing Sheets

(56) References Cited

U.S. PATENT DOCUMENTS

| | | | | |
|---|---|---|---|---|
| 6,747,872 B1* | 6/2004 | Patel | G06F 1/20 | 165/104.33 |
| 6,772,604 B2* | 8/2004 | Bash | H05K 7/20836 | 236/49.3 |
| 7,430,118 B1* | 9/2008 | Noteboom | H05K 7/20745 | 165/104.33 |
| 7,463,950 B1* | 12/2008 | Brey | H05K 7/20745 | 361/695 |
| 8,151,578 B1* | 4/2012 | Morales | F24F 3/0442 | 62/259.2 |
| 2001/0029163 A1* | 10/2001 | Spinazzola | H05K 7/20745 | 454/184 |
| 2004/0141542 A1* | 7/2004 | Sharma | G01K 7/42 | 374/141 |
| 2005/0225936 A1* | 10/2005 | Day | H05K 7/20745 | 361/679.47 |
| 2006/0225446 A1* | 10/2006 | Bash | F24F 3/048 | 62/178 |
| 2007/0213000 A1* | 9/2007 | Day | H05K 7/20745 | 454/184 |
| 2008/0266794 A1* | 10/2008 | Malone | H05K 7/20745 | 361/695 |
| 2009/0210096 A1* | 8/2009 | Stack | F24F 11/0009 | 700/278 |
| 2010/0252233 A1* | 10/2010 | Absalom | H05K 7/20745 | 165/57 |
| 2011/0306287 A1* | 12/2011 | Takagi | F24F 11/0079 | 454/184 |
| 2012/0006038 A1* | 1/2012 | Sharma | H05K 7/20745 | 62/97 |
| 2013/0189916 A1 | 7/2013 | Chen et al. | | |

* cited by examiner

DEVICE FOR CONTROLLING AIRFLOW FIELD AND METHOD THEREOF

BACKGROUND

The present invention is related to a device for controlling airflow field and a method thereof, particularly a device for controlling an airflow field and the method thereof applied to detect a short circulation airflow field.

DESCRIPTION OF RELATED ART

An air flux of an ordinary air condition machine applied to a data center is usually determined according to an average temperature in the data center. However, when the air condition machine is applied to different data center, another different average temperature will be retrieved. Particularly, a horizontal-flow air condition machine applied to a data center is not able to detect a short circulation airflow field in the data center via the average temperature. The air flux supplied into the data center is possibly insufficient, and the data center is therefore partially overheated.

In order to solve the above mentioned problem, multiple sensors are usually arranged in the data center to detect an overheat condition occurred in a part of the data center and determine a short circulation airflow field. However, a single arrangement of the sensors cannot be applied to multiple different data centers.

SUMMARY

The purpose of the present invention is to provide a device for controlling an airflow field and the method thereof applied to detect a short circulation airflow field.

In order to make the above purpose, a method for controlling an airflow field is provided in the present invention. The method for controlling an airflow field is applied to an air conditioning space. The method is included of: supplying a cooling airflow into the air conditioning space, smoothly altering flux of the cooling airflow, retrieving a backflow temperature of the cooling airflow, and comparing variation of the backflow temperature with a flux variation of the cooling airflow. Only a part of the air conditioning space is covered in the circulation range of the cooling airflow if a variation of the backflow temperature is in the same tendency as the variation of the flux of the cooling airflow.

The method for controlling an airflow field is preferably further included of: altering the flux of the cooling airflow to be higher than the initial flux if the shot circulation airflow is determined in the air conditioning space.

The cooling airflow is preferably driven by a fan.

Preferably, the fan is electrically connected to a processing module and controlled by the processing module, and the flux of the cooling airflow is thereby altered.

The method for controlling an airflow field is preferably further included of: delivering an alert signal by the processing module if the short circulation airflow field is determined in the air conditioning space.

In order to make the above purpose, another method for controlling an airflow field is provided in the present invention. The method for controlling an airflow field is applied to an air conditioning space. The method is included of: supplying a cooling airflow into the air conditioning space, smoothly altering flux of the cooling airflow as a sloping curve, retrieving a backflow temperature of the cooling airflow, and comparing variation of the backflow temperature with a flux variation of the cooling airflow. Only a part of the air conditioning space is covered in the circulation range of the cooling airflow if a variation of the backflow temperature is in the same tendency as the variation of the flux of the cooling airflow.

The method for controlling an airflow field is preferably further included of: altering the flux of the cooling airflow to be the initial flux if the variation of the backflow temperature and the variation of the flux of the cooling airflow are in opposite tendencies.

The method for controlling an airflow field is preferably further included of: altering the flux of the cooling airflow to be higher than the initial flux if the short circulation airflow field is determined in the air conditioning space.

The cooling airflow is preferably driven by a fan.

The fan is preferably connected to a processing module and controlled by the processing module, and the flux of the cooling airflow is thereby altered.

The method for controlling an airflow field is preferably further included of: delivering an alert signal by the processing module if the short circulation airflow field is determined in the air conditioning space.

In order to make the above purpose, a device for controlling an airflow field is provided in the present invention. The device is included of: an air conditioning cabinet and a chiller. The air conditioning cabinet is includes of a coil pipe, a fan and a processing module. The fan is arranged corresponding to the coil pipe. The processing module is electrically connected to the fan and the flux of the fan is thereby controlled by the processing module. The chiller is connected to the coil pipe, cooling water is supplied in to the coil pipe, and the cooling airflow is thereby cooled. Wherein, the processing module is used to slowly and smoothly alter the flux of the cooling airflow according to a backflow temperature.

The processing module is preferably included of a control unit, the control unit is electrically connected to the fan, and the fan is thereby controlled by the control unit.

The air conditioning cabinet is preferably included of a thermo sensor for retrieving the backflow temperature, and the thermo sensor is electrically connected to the processing module to transmit the backflow temperature to the processing module.

The processing module is preferably included of a calculating unit, and the calculating is electrically connected to the thermo sensor and the control unit. A variation of the backflow temperature is compared with a variation of the flux of the cooling airflow by the calculating unit.

The short circulation airflow field is able to be determined by the method and the device of the present invention according to a response corresponding to a disturbance added into the airflow field in the air conditioning space.

DETAILED DESCRIPTION OF EMBODIMENT

Figure 1:
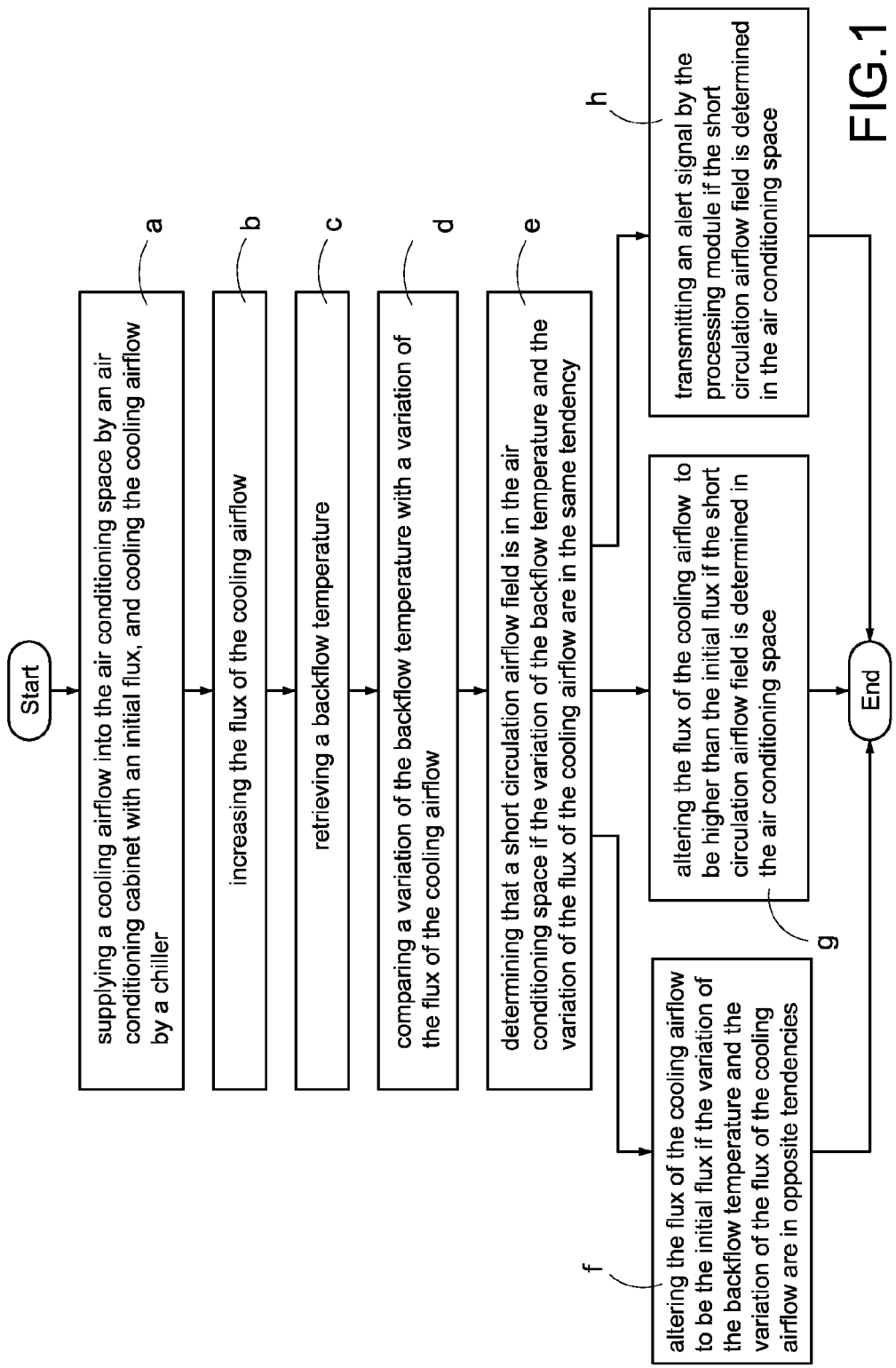
FIG. 1 is a flow chart showing the method of the present invention.

Please refer to FIG. 1. A method for controlling an airflow field and a device thereof are disclosed in the first embodiment of the present invention. The method and the device are used for thermostat control in an air conditioning space 10. A plurality of server cabinets 20 are provided in the air conditioning space 10. At least a server 21 is provided in one of the server cabinets 20. Heats generated by the server 21 spreads in the air conditioning space 10 while the server 21 is under operation. In the present embodiment, the method of the airflow field control is included of the steps below.

Figure 2:
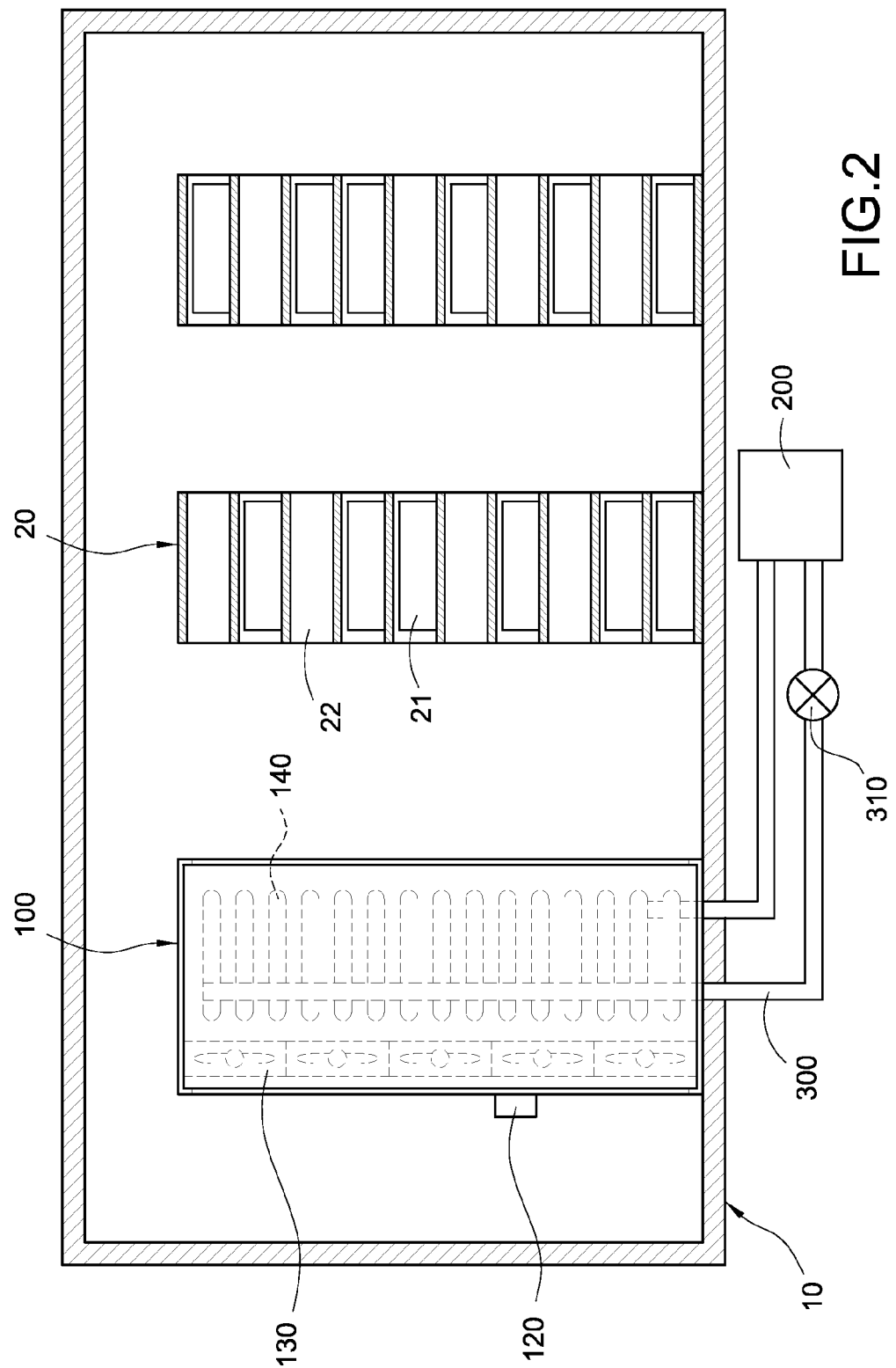
FIG. 2 is a schematic view showing the arrangement of the device of the present invention.
Figure 3:
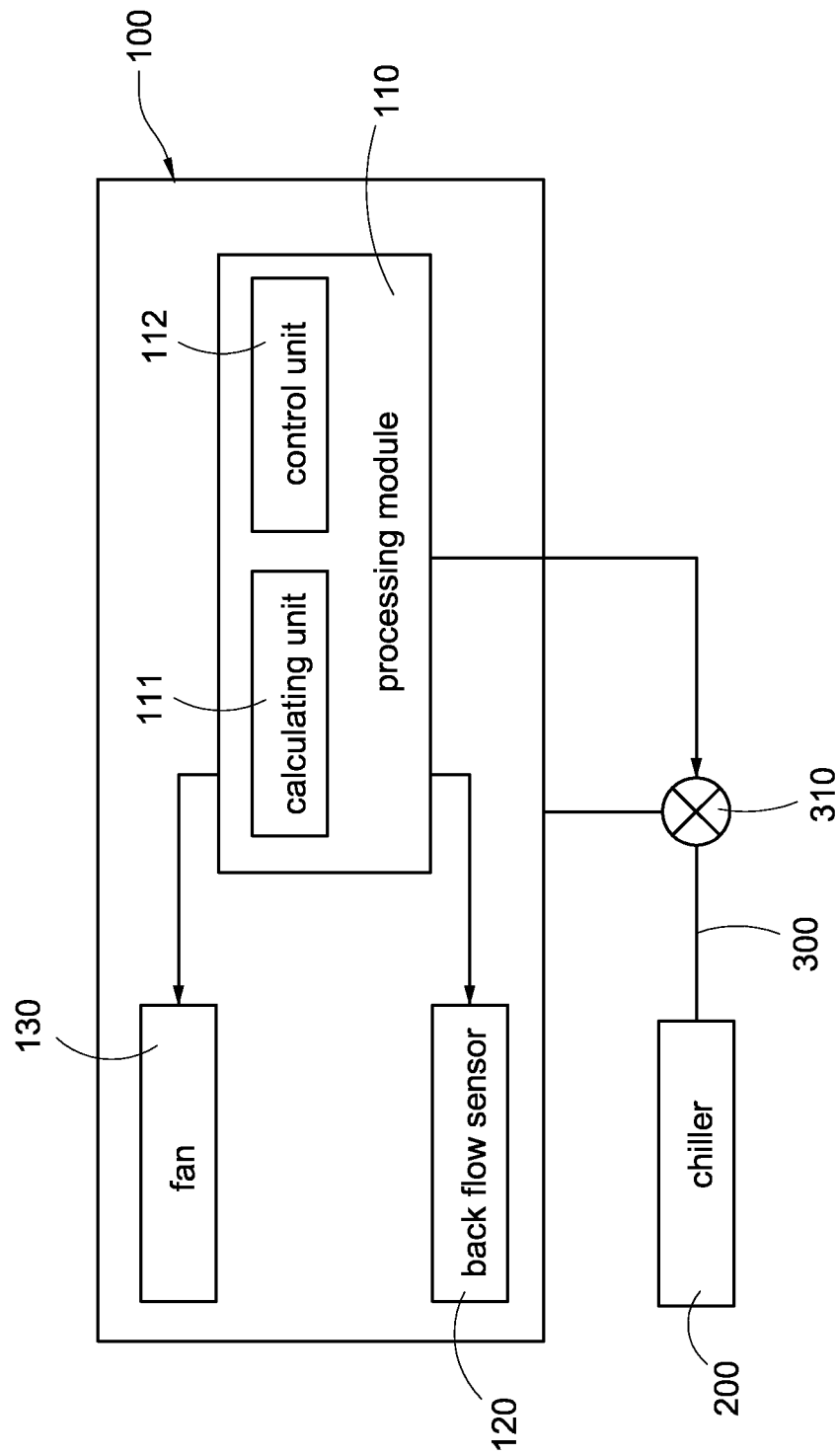
FIG. 3 is a schematic view showing a control system of the device of the present invention.

Refer to FIG. 1-3. In step a, providing a device for controlling an airflow field. The device is included of an air conditioning cabinet 100 and a chiller 200, wherein the air conditioning cabinet 100 is provided in the air conditioning space 10, and the chiller 200 is provided outside of the air conditioning space 10. The air conditioning cabinet 100 is included of a processing module 110, a thermo sensor 120, a fan 130 and a coil pipe. The processing module 110 is included of a calculating unit 111 electrically connected to the back flow sensor 120 and a control unit 112 electrically connected to the fan 130. A rotational speed of the fan 130 is thereby controlled by the processing module 110. The thermo sensor 120 is used to retrieve a backflow temperature from the airflow sucked into the fan 130 and transmit the backflow temperature to the calculating unit 111. The coil pipe 140 is connected to the chiller 200 via a cooling piping line 300, and cooling water is thereby supplied into the coil pipe 140 via the cooling piping line 300. A valve 310 is preferably provided on the cooling piping line 300, and the flow rate of the cooling water is thereby controlled by the valve 310. The valve is preferable electrically connected to the control unit 112, and the flow rate of the cooling water could be controlled by the control unit 112.

Figure 4:
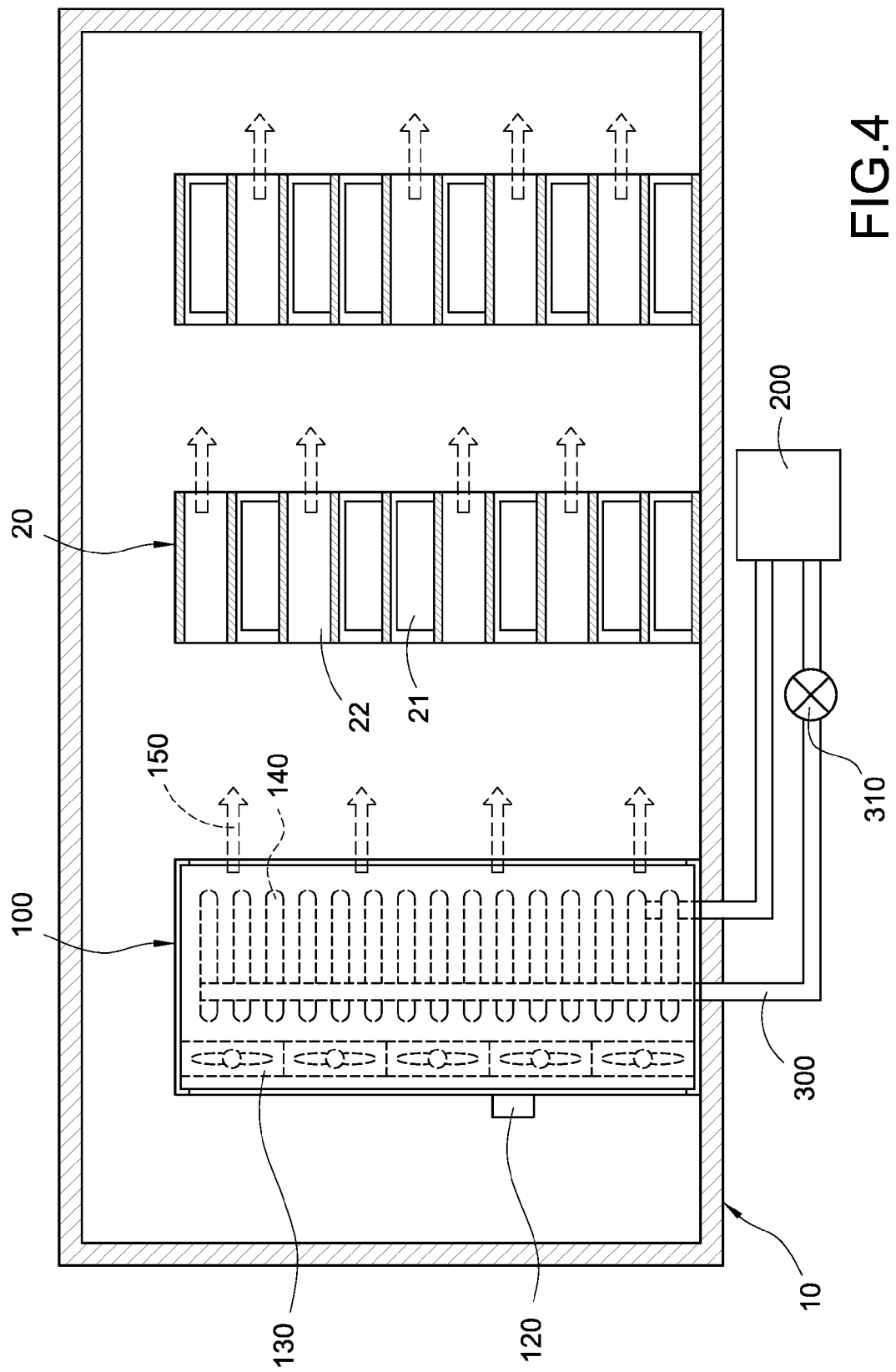
FIG. 4 is a schematic view showing a working status of the device of the present invention.

Refer to FIGS. 3 and 4. Cooling water is supplied into the coil pipe 140 via the cooling pipe line by the chiller 200. Air in the air conditioning space 10 is driven by the fan 130 and a cooling airflow 150 is thereby generated. The cooling airflow 150 is supplied to flow through the coil pipe 140 with an initial flux. The cooling airflow 150 is exchanged heat with the coil pipe 140 and is thereby cooled. The heat generated by the server cabinet 200 is absorbed by the cooling airflow 150 flows into the air conditioning space 10. Thereby, the air conditioning space 10 is cooled by the cooling airflow 150. The cooling airflow 150 flows back to the air conditioning cabinet 100 after a circulation in the air conditioning space 10, and starts next circulation. The control unit continually adjusts the flux of the cooling airflow and the flow rate of the cooling water until a stable backflow temperature is retrieved by the thermo sensor. Thereby, the air conditioning space 10 is maintained in an isothermal status.

In the present embodiment, some of the servers 21 are took away from the server cabinet 20, and some empties 22 are formed in the server cabinet 20. Therefore, a short circulation airflow field is formed while the cooling airflow 150 flows through the empties 22. The air conditioning space 10 is not fully covered by the cooling airflow 150, and some server cabinets far from the air conditioning cabinet 100 might not be cooled by the cooling airflow 150. The short circulation could be determined by steps c-f below.

In step b, when the cooling airflow 150 stably in the air conditioning space 10 is under a stably circulation, altering the rotating speed of the fan 130 by the control unit 112 to add a disturbance into the cooling airflow 150 as a sloping curve variation. In the present embodiment, the rotating speed of the fan 130 is slowly and smoothly increased by the control unit 112, and the flux of the cooling airflow 150 is thereby increased.

In step c, a backflow temperature is retrieved by the thermo sensor 120 from the cooling airflow 150 sucked into the air conditioning cabinet 100, and transmitting the backflow temperature to the calculating unit 111.

In step d, a variation of the backflow temperature with a flux variation of the cooling airflow 150 is compared by the calculating unit 111.

Figure 5:
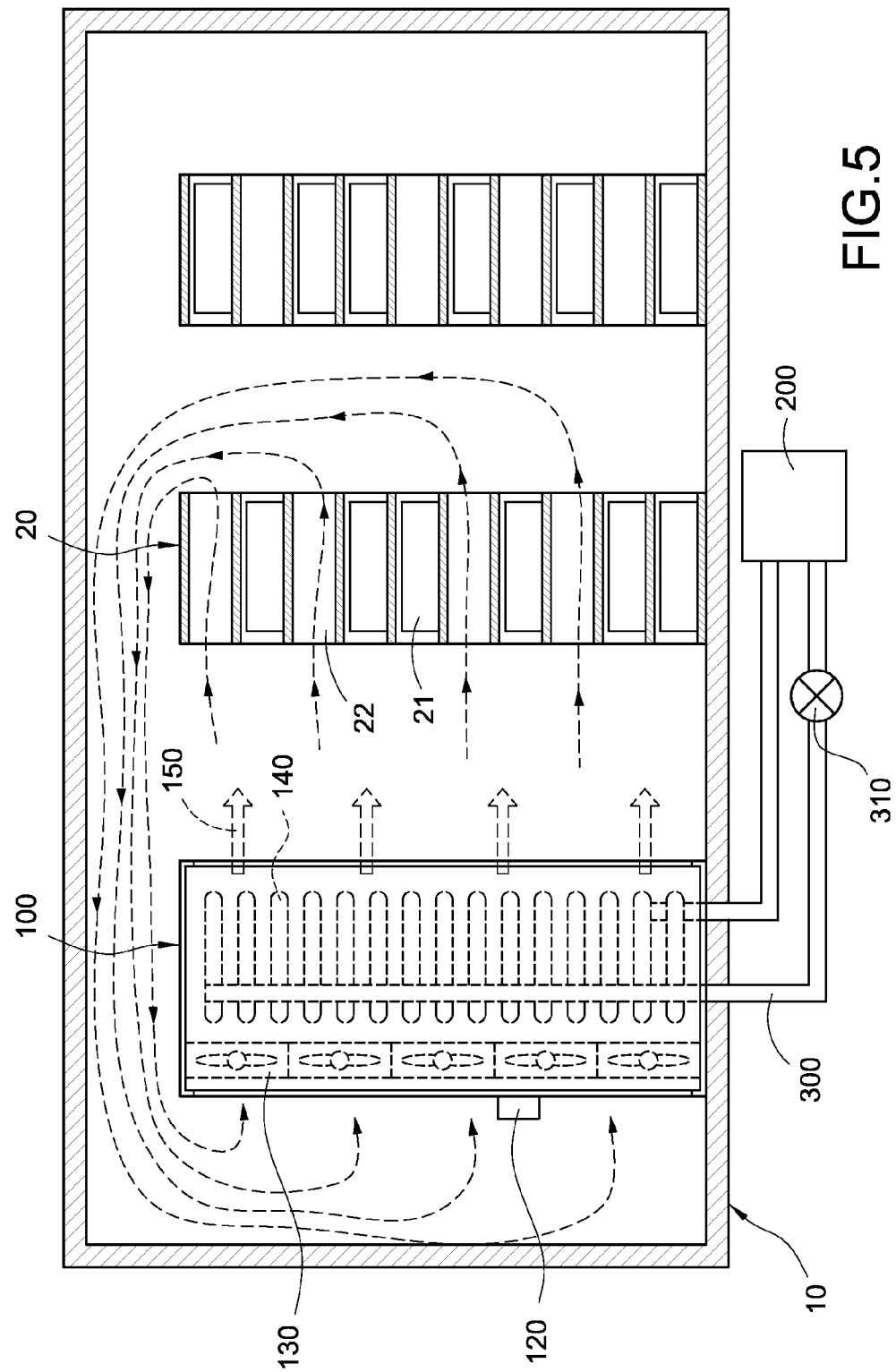
FIG. 5 is a schematic view showing a short circulation airflow field.

Refer to FIGS. 3 and 5. Step e: If a short circulation airflow field is determined in the air conditioning space 10, more parts of the air conditioning space 10 are covered by the cooling airflow 150 while the flux of the cooling airflow 150 is increased. Therefore, the cooling airflow could flow pass longer distance and take more hear from the server cabinet 20 far away the air conditioning cabinet 100, and the backflow temperature of the cooling airflow 150 is increased.

If the variation of the backflow temperature and the variation of the flux of the cooling airflow 150 are in the same tendency (the backflow temperature is increased while the flux of the cooling airflow 150 increased), a short circulation airflow field is determined in the air conditioning space 10. A step f or a step g below is chosen according to the result of the comparison.

Figure 6:
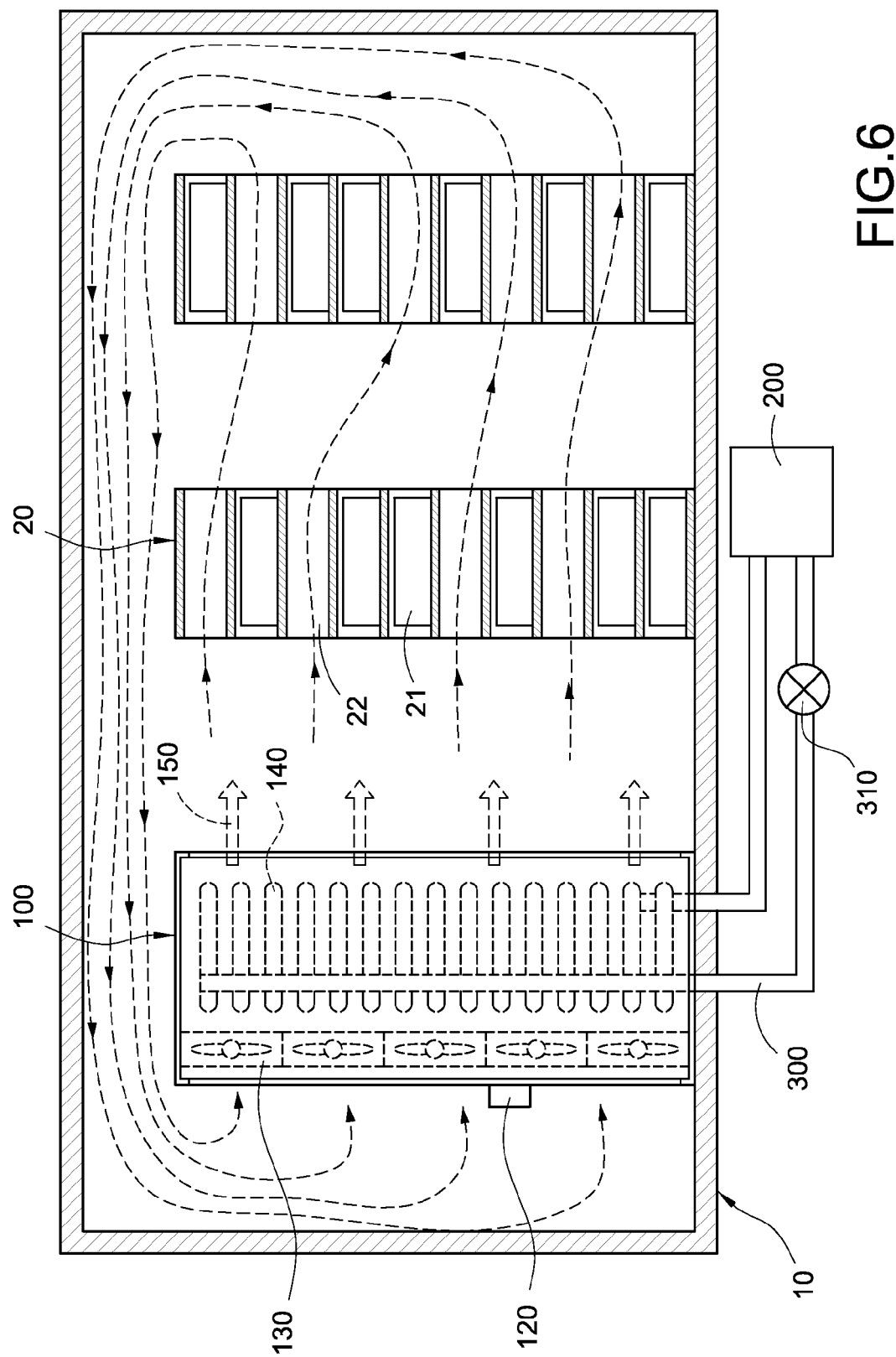
FIG. 6 is a schematic view showing a full circulation airflow.

Refer to FIGS. 3 and 6. In step f, a comparison result is transmitted from the calculating unit 111 to the control unit 112. If the variation of the backflow temperature and the variation of the flux of the cooling airflow are in opposite tendencies (the backflow temperature is decreased while the flux of the cooling airflow 150 increased), the air conditioning space is fully covered in the circulation range of the cooling airflow 150. The flow area of the cooling airflow 150 is retained while the flux of the cooling airflow 150 is increased. Therefore, the backflow temperature is decreased corresponding to the increasing of the flux of the cooling airflow 150 in the same flow area. Accordingly, the flux of the cooling airflow 150 should be altered to be the initial flux by the control unit 112.

In step g, if the short circulation airflow field in the air conditioning space 10 is determined, a comparison result is transmitted from the calculating unit 111 to the control unit 112 and the flux of the cooling airflow 150 is altered to be higher than the initial flux. Thereby, the air conditioning space 10 is fully covered in the circulation range of the cooling airflow 150.

Please refer to FIG. 1. A method for controlling an airflow field and a device thereof are disclosed in the second embodiment of the present invention. The method and the device are used for thermostat control in an air conditioning space 10. A plurality of server cabinets 20 are provided in the air conditioning space 10. At least a server 21 is provided in one of the server cabinets 20. Heats generated by the server 21 spreads in the air conditioning space 10 while the server 21 is under operation. In the present embodiment, the method of the airflow field control is included of the steps below.

Refer to FIG. 1-3. In step a, providing a device for controlling an airflow field. The device is included of an air conditioning cabinet 100 and a chiller 200, wherein the air conditioning cabinet 100 is provided in the air conditioning space 10, and the chiller 200 is provided outside of the air conditioning space 10. The air conditioning cabinet 100 is included of a processing module 110, a thermo sensor 120, a fan 130 and a coil pipe. The processing module 110 is included of a calculating unit 111 electrically connected to the back flow sensor 120 and a control unit 112 electrically connected to the fan 130. A rotational speed of the fan 130 is thereby controlled by the processing module 110. The thermo sensor 120 is used to retrieve a backflow temperature from the airflow sucked into the fan 130 and transmit the backflow temperature to the calculating unit 111. The coil pipe 140 is connected to the chiller 200 via a cooling piping line 300, and cooling water is thereby supplied into the coil pipe 140 via the cooling piping line 300. A valve 310 is preferably provided on the cooling piping line 300, and the flow rate of the cooling water is thereby controlled by the valve 310. The valve is preferable electrically connected to the control unit 112, and the flow rate of the cooling water could be controlled by the control unit 112.

Refer to FIGS. 3 and 4. Cooling water is supplied into the coil pipe 140 via the cooling pipe line by the chiller 200. Air in the air conditioning space 10 is driven by the fan 130 and a cooling airflow 150 is thereby generated. The cooling airflow 150 is supplied to flow through the coil pipe 140 with an initial flux. The cooling airflow 150 is exchanged heat with the coil pipe 140 and is thereby cooled. The heat generated by the server cabinet 200 is absorbed by the cooling airflow 150 flows into the air conditioning space 10. Thereby, the air conditioning space 10 is cooled by the cooling airflow 150. The cooling airflow 150 flows back to the air conditioning cabinet 100 after a circulation in the air conditioning space 10, and starts next circulation. The control unit continually adjusts the flux of the cooling airflow and the flow rate of the cooling water until a stable backflow temperature is retrieved by the thermo sensor. Thereby, the air conditioning space 10 is maintained in an isothermal status.

In the present embodiment, some of the servers 21 are took away from the server cabinet 20, and some empties 22 are formed in the server cabinet 20. Therefore, a short circulation airflow field is formed while the cooling airflow 150 flows through the empties 22. The air conditioning space 10 is not fully covered by the cooling airflow 150, and some server cabinets far from the air conditioning cabinet might not be cooled by the cooling airflow 150. The short circulation could be determined by steps c-f below.

In step b, when the cooling airflow 150 stably in the air conditioning space 10 is under a stably circulation, altering the rotating speed of the fan 130 by the control unit 112 to add a disturbance into the cooling airflow 150 as a sloping curve variation. In the present embodiment, the rotating speed of the fan 130 is slowly and smoothly increased by the control unit 112, and the flux of the cooling airflow 150 is thereby increased.

In step c, a backflow temperature is retrieved by the thermo sensor 120 from the cooling airflow 150 sucked into the air conditioning cabinet 100, and transmitting the backflow temperature to the calculating unit 111.

In step d, a variation of the backflow temperature with a flux variation of the cooling airflow 150 is compared by the calculating unit 111.

Refer to FIGS. 3 and 5. Step e: If a short circulation airflow field is determined in the air conditioning space 10, more parts of the air conditioning space 10 are covered by the cooling airflow 150 while the flux of the cooling airflow 150 is increased. Therefore, the cooling airflow could flow pass longer distance and take more hear from the server cabinet 20 far away the air conditioning cabinet 100, and the backflow temperature of the cooling airflow 150 is increased.

If the variation of the backflow temperature and the variation of the flux of the cooling airflow 150 are in the same tendency (the backflow temperature is increased while the flux of the cooling airflow 150 increased), a short circulation airflow field is determined in the air conditioning space 10. A step f or a step h below is chosen according to the result of the comparison.

Refer to FIGS. 3 and 6. In step f, a comparison result is transmitted from the calculating unit 111 to the control unit 112. If the variation of the backflow temperature and the variation of the flux of the cooling airflow are in opposite tendencies (the backflow temperature is decreased while the flux of the cooling airflow 150 increased), the air conditioning space is fully covered in the circulation range of the cooling airflow 150. The flow area of the cooling airflow 150 is retained while the flux of the cooling airflow 150 is increased. Therefore, the backflow temperature is decreased corresponding to the increasing of the flux of the cooling airflow 150 in the same flow area. Accordingly, the flux of the cooling airflow 150 should be altered to be the initial flux by the control unit 112.

Refer to FIGS. 3 and 5. In step h, a comparison result is transmitted from the calculating unit 111 to the control unit 112. If the short circulation airflow field in the air conditioning space 10 is determined, an alert signal is delivered to notify an operator adjust the flux of the cooling airflow 150 until the cooling airflow 150 returns to the stable status. The alert signal is possibly a voice signal or a light signal.

In the method of airflow field control, a disturbance is added into airflow field in the air conditioning space 10. A short circulation airflow field is determined according to the variation of the flux and the temperature in the airflow field. Therefore, the current equipment could be preserved.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for controlling an airflow field applied to an air conditioning space, the method comprising the steps of:
   (a). supplying a cooling airflow into the air conditioning space with an initial flux;
   (b). continuously altering the flux of the cooling airflow;
   (c). retrieving a backflow temperature from a backflow of the cooling airflow;
   (d). comparing a variation of the backflow temperature with a variation of the flux of the cooling airflow; and
   (e). determining that a short circulation airflow field is in the air conditioning space and the circulation range of the cooling airflow only occupies a part of the air conditioning space if the variation of the backflow temperature and the variation of the flux of the cooling airflow are in the same tendency.

2. The method for controlling an airflow field according to claim 1, further comprising a step (f) after the step (e) and the step (f) being of: altering the flux of the cooling airflow to be the initial flux if the variation of the backflow temperature and the variation of the flux of the cooling airflow are in opposite tendencies.

3. The method for controlling an airflow field according to claim 1, further comprising a step (g) after the step (e) and the step (e) being of: altering the flux of the cooling airflow to be higher than the initial flux if the short circulation airflow field is determined in the air conditioning space.

4. The method for controlling an airflow field according to claim 1, wherein the cooling airflow is driven by a fan in the step (b).

5. The method for controlling an airflow field according to claim 4, wherein the fan is electrically connected to a processing module, and in the step (c), the fan is controlled by the processing module to alter the flux of the cooling airflow.

6. The method for controlling an airflow field according to claim 5, further comprising a step (h) after the step (e) and the step (h) being of: transmitting an alert signal by the processing module if the short circulation airflow field is determined in the air conditioning space.

7. The method for controlling an airflow field according to claim 6, wherein the alert signal is a voice signal or a light signal.

8. A method for controlling an airflow field applied to an air conditioning space comprising the steps of:
  (a) supplying a cooling airflow into the air conditioning space with an initial flux;
  (b) smoothly and continuously altering the flux of the cooling airflow as a sloping curve variation;
  (c) retrieving a backflow temperature from a backflow of the cooling airflow;
  (d) comparing a variation of the backflow temperature with a variation of the flux of the cooling airflow; and
  (e) determining that a short circulation airflow field in the air conditioning space and the circulation range of the cooling airflow only occupies a part of the air conditioning space if the variation of the backflow temperature and the variation of the flux of the cooling airflow are in the same tendency.

9. The method for controlling an airflow field according to claim 8, further comprising a step (f) after the step (e) and the step (f) being of: altering the flux of the cooling airflow to be the initial flux if the variation of the backflow temperature and the variation of the flux of the cooling airflow are in opposite tendencies.

10. The method for controlling an airflow field according to claim 8, further comprising a step (g) after the step (e) and the step (g) being of: altering the flux of the cooling airflow to be higher than the initial flux if the short circulation airflow field is determined in the air conditioning space.

11. The method for controlling an airflow field according to claim 8, wherein the cooling airflow is driven by a fan in the step (b).

12. The method for controlling an airflow field according to claim 11, wherein the fan is electrically connected to a processing module, and in the step (c), the fan is controlled by the processing module to alter the flux of the cooling airflow.

13. The method for controlling an airflow field according to claim 12, further comprising a step (h) after the step (e) and the step (h) being of: transmitting an alert signal by the processing module if the short circulation airflow field is determined in the air conditioning space.

14. A device for controlling an airflow field comprising:
  an air conditioning cabinet, comprising a coil pipe, a fan, and a processing module, the fan being arranged corresponding to the coil pipe, a cooling airflow being supplied across the coil pipe by the fan, and the processing module being electrically connected to the fan to control the flux of the fan; and
  a chiller, connected to the coil pipe and supplying cooling water to cool the cooling airflow;
  wherein,
    the processing module is used to smoothly and continuously alter the flux of the cooling airflow, and adjust the flux of the cooling airflow according to a backflow temperature of the cooling airflow,
    the processing module comprises a control unit, which is connected to the fan in order to control the fan,
    the air conditioning cabinet comprises a temperature sensor for retrieving the backflow temperature, the temperature sensor being electrically connected to the processing module in order to transmit the backflow temperature to the processing module, and
    the processing module comprises a calculating unit, which is electrically connected to the temperature sensor and the control unit, the calculating unit comparing a variation of the backflow temperature and another variation of the flux of the cooling airflow.

* * * * *